March 14, 1972 J. F. SCHNECK 3,649,392

THIN-FILM CIRCUIT FORMATION

Filed Dec. 6, 1968 2 Sheets-Sheet 1

PRIOR ART I

PRIOR ART II

INVENTOR
J.F. SCHNECK
BY [signature]
ATTORNEY

March 14, 1972 J. F. SCHNECK 3,649,392

THIN-FILM CIRCUIT FORMATION

Filed Dec. 6, 1968 2 Sheets-Sheet 2

United States Patent Office 3,649,392
Patented Mar. 14, 1972

3,649,392

THIN-FILM CIRCUIT FORMATION

James F. Schneck, Emmaus, Pa., assignor to Western Electric Company, Incorporated, New York, N.Y.

Filed Dec. 6, 1968, Ser. No. 781,817
Int. Cl. H05k *1/00;* H01l *7/50*
U.S. Cl. 156—3 6 Claims

ABSTRACT OF THE DISCLOSURE

In the manufacture of thin-film circuits from substrates having superimposed films of a resistive and a conductive material, the undercutting of resistors or the unintentional reduction of conductor-termination pad dimensions by misregistration is eliminated through the use of a first "rough" mask to permit removal of the conductive film from the general area where the resistors will be formed. A second mask in the configuration of the entire thin-film circuit is used to permit the removal of the remaining unwanted portions of the thin films. Since the resistor portion of the second mask falls directly on the resistive film in the general area where the conductive film was removed by the first mask, and the second mask contains the entire thin-film circuit, both undercutting and misregistration, which leads to unintentional reduction of conductor-termination pad dimensions, are avoided.

BACKGROUND OF THE INVENTION

This invention relates to methods of forming thin-film circuits and, more particularly, to methods of forming thin-film circuits from substrates coated with superimposed films of the materials from which the resistors, capacitors, conductors and other component parts of the circuit are to be made.

A typical thin-film circuit may include a plurality of interconnected thin-film components, such as resistors and capacitors, formed of superimposed films of conductive, resistive and/or nonconductive material supported on a single substrate. It has been found that such a circuit may be best fabricated by sequentially depositing the several films as coextensive films, and then selectively and sequentially etching the films to their desired configurations. This process not only eliminates the need for mechanical masking during deposition but also, if the depositions are effected in a single vacuum processing machine, eliminates the possibility of contamination between depositions and minimizes the time and cost of fabrication.

Typically, to form a thin-film circuit of the type having a plurality of interconnected resistors, a film of a resistive material for forming devices is first deposited on the surface of the substrate and then a film of a conductive material for forming conductors and termination pads is deposited on the resistive film. Either one of two techniques is then commonly employed to sequentially and selectively etch the films to form the desired circuit.

In the first technique, the conductive film is masked with an etch-resist material in the configuration of the conductors and termination pads. The conductive material is then removed by etching in all places not protected by the etch-resist material to form the conductors and termination pads. This also exposes the resistor material in the places where the resistors are to be made. After removal of the first mask, a second etch-resist mask in the configuration of the complete circuit is formed on the substrate. The conductor-termination pad portions of the second mask are registered, as well as possible, with the conductors and termination pads formed in the first step to protect these elements while the resistive material is being etched to form the resistor portion of the thin-film circuit.

One problem with this technique is the necessity for precise registration between the two masks. As pointed out, the conductors and termination pads are protected during the second etching step by registering the second mask with the conductors and termination pads previously formed. Consequently, when the conductor widths are very narrow, e.g., .002 to .004 of an inch wide, the second mask must register very precisely with the prior formation of conductors and termination pads. This is extremely difficult, if not impossible to do, and misregistration occurs which results in the removal of substantial portions of the preformed conductors and termination pads.

This misregistration may be avoided, in accordance with the second technique, by masking the thin-film surface, as a first step, in the configuration of the entire thin-film circuit and etching away the unprotected conductive and resistive materials. This forms the thin-film circuit consisting of conductors, resistors and termination pads but with the conductive material covering and, therefore, shorting the resistors. Consequently, in a second step, the conductive material covering the resistors is removed by: (1) masking the conductors and termination pads completely, without regard to shape and size, while leaving the resistor configuration unmasked and (2) etching away the conductive material from over the resistor configuration. While this technique avoids the misregistration problem, it presents a different problem, equally as serious. During the first etching step, the etchants not only etch their way vertically downward through the films, but also dissolve material sideways in a direction parallel to the substrate. This causes undercutting so that the thin-film circuit is much narrower near the substrate than at the surface where it was masked. This effect is particularly acute where the conductive film is several times thicker than the resistive film, as is usually the case. The fact that the conductor and termination portions of the circuit are narrower at the bottom than the top, for all practical purposes, is not detrimental. However, the fact that the resistor portion is narrower than the mask from which it is made, is detrimental because the incorrect physical dimensions yield an incorrect resistance value. The correct final resistance value of the resistor depends on having, among other things, the correct starting dimensions which are those of the mask.

The disadvantages, then, of the present methods are that either undercut resistors are formed on the substrate or portions of the conductors and termination pads are removed because of misregistration. Accordingly, it is an object of this invention to provide new and improved methods for: (1) making thin-film circuits without the need for precise registration of the masks and (2) making thin-film circuit components or devices such as resistors, without undercutting.

SUMMARY OF THE INVENTION

The foregoing and other objects of the invention are accomplished in accordance with certain features of the invention by providing: a first "rough" mask, which permits removal of the conductive material in the approximate areas where the resistors are to be formed; and a second final mask of the complete circuit, which permits removal of the conductive and resistive materials to form the entire circuit at one time.

Since no conductors have been formed by the first mask, the second mask does not require impractically precise registration. Also, since there is no conductive material over the resistive material when it is masked, the device portion of the thin-film circuit is not undercut and the devices are formed to the dimensions of the mask.

DESCRIPTION OF THE DRAWINGS

Other objects, advantages and features of the invention will be apparent from the following detailed description thereof, when considered in conjunction with the appended drawings, in which.

Figure 1:
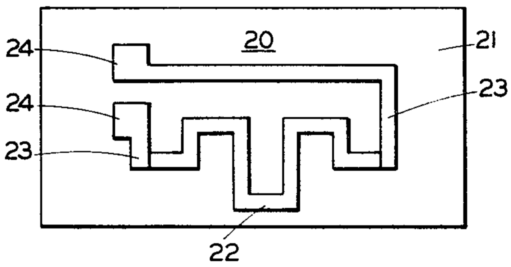
FIG. 1 is a plan view of a simple thin-film circuit.

In the drawings, the thickness of the films has been exaggerated for the sake of clarity.

DETAILED DESCRIPTION

Referring now to FIG. 1, for purposes of illustration, the invention will be described in connection with the formation of a simple thin-film circuit 20 which includes a substrate 21, a meandering resistor 22 as the component or device, a pair of conductors 23—23, and a pair of termination pads 24—24. It should be noted, however, that this is only for simplicity of explanation and that more complex circuits involving intricate resistor networks, capacitors and inductors are also within the contemplation of this invention.

In the following description, the preparation of a coated substrate from which the circuit 20 may be formed will first be explained, followed by a description of the prior art techniques of selectively etching the coated substrate to form the circuit and, finally, how the problems of the prior art techniques are overcome in accordance with the present invention.

PREPARATION OF COATED SUBSTRATE

Figure 2:
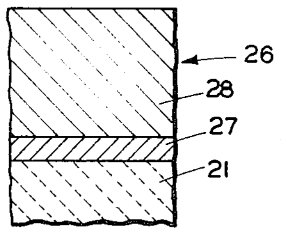
FIG. 2 is a cross-section of a portion of a coated substrate from which the thin-film circuit of FIG. 1 may be formed.

Referring now to FIG. 2, there is shown a coated substrate 26 from which the thin-film circuit 20 may be formed. The coated substrate 26 includes the substrate 21 having thereon coextensive, thin films 27 and 28 of a resistive material and a conductive material, respectively.

The substrate 21 is composed of a material which is electrically nonconductive and thermally conductive. Suitable substrate materials which may be employed are glass, fused silica, glazed or unglazed ceramic, quartz and sapphire.

The resistive film 27 for the device portion of the circuit 20 is advantageously composed of a film-forming material, such as tantalum or compounds thereof, so as to enable adjustment of the resultant resistor 22 (FIG. 1) by anodization. Anodization reduces the cross-section of the resistor 22, thereby increasing its resistance. Preferably, as disclosed in U.S. Pat. 3,242,006, the film-forming material is tantalum nitride which has been found to produce very stable resistors. The thickness of the resistive film is generally within the range of 1000 A. to 2000 A.

The conductive film 28, from which the conductors 23—23 and termination pads 24—24 (FIG. 1) are formed, is selected so as to have good adherence to the resistive film 27, high conductivity, resistance to corrosion and bonding compatibility with the technique to be employed for attaching external leads to the circuit 20. Advantageously, to meet these requirements satisfactorily, the film 28 is a composite of two or more materials. For example, the film 28 may comprise: (1) a thin layer of a "glue" material, such as chromium, Nichrome (80% nickel, 20% chromium) or titanium, which has very good adherence to tantalum or tantalum nitride and (2) a layer of conductive material, such as gold or palladium. Where external leads are to be attached by soldering a composite film 28 formed of Nichrome, copper and palladium may be used, as described in U.S. Pat. 3,413,711. Typically, the film 28 is about 10,000 A. to 15,000 A. thick with the "glue" layer being about 200 A. to 500 A. thick. Although the film 28 is generally composed of two or more layers, for simplicity herein it will be treated as a single entity.

The films 27 and 28 are deposited on the substrate 21 by conventional vacuum deposition techniques. Thus, the film 27 is typically deposited by cathodic sputtering and the film 28 by evaporation. For details on these techniques reference may be had to L. Holland, "Vacuum Deposition of Thin Films," London: Chapman Hall, Ltd., 1963.

As noted above, in the prior art, either of two techniques have been employed for sequentially and selectively etching the films 27 and 28 to form the circuit 20.

PRIOR ART I

In accordance with the first technique and starting with the coated substrate 26, the thin-film circuit 20 is made by: (1) first masking the intermediate coated substrate 26 in the configuration of the conductors 23—23 and the termination pads 24—24 with an etch-resist mask; (2) etching the film 28 to remove the film in all but the conductor-termination pad areas; (3) masking the coated substrate in the configuration of both the resistor and the conductors and termination pads; and (4) etching to form the resistor 22.

Figure 3:
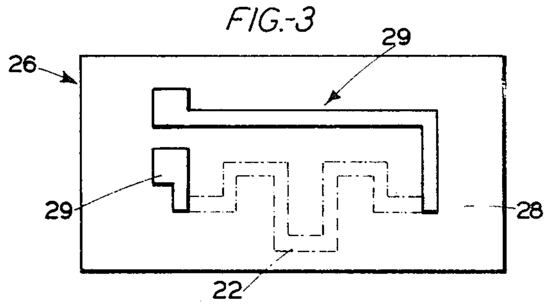
FIGS. 3–5 are views illustrating some of the steps involved in a first prior art technique of selectivity etching the coated substrate of FIG. 2 to form the circuit of FIG. 1.

More specifically, referring to FIG. 3, the film 28 is coated with a photoresist which is selectively exposed to light, developed and fixed to form a first mask 29 covering the portions of the film 28 which are to serve as the conductors 23—23 and the termination pads 24—24. The photoresist resists etching solutions which will remove the film 28.

The photolithographic technique employed is conventional and generally comprises, in the case of a negative resist, such as Kodak KTFR, KPR or KMER, exposing those portions which are to be etch-resistant to ultraviolet light. In the case of a positive resist, such as Azoplate AZ–1350, sold by the Shipley Co., Newton, Mass., the portions not to be etch-resistant are exposed to light. For a negative photoresist, development hardens the exposed portions and removes the unexposed portions, while for a positive photoresist, development removes the exposed portions. In either case, the mask 29 shown in FIG. 3 is produced. It should be noted that in lieu of using a photolithographic technique to form the mask 29, the mask can be formed by any other suitable technique, such as by silk-screening an each-resistant material onto the film 28 in the pattern of the mask 29.

Figure 4:
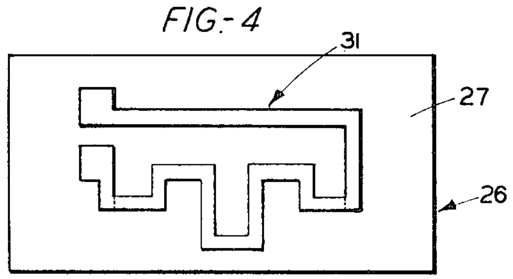
Figure 5:
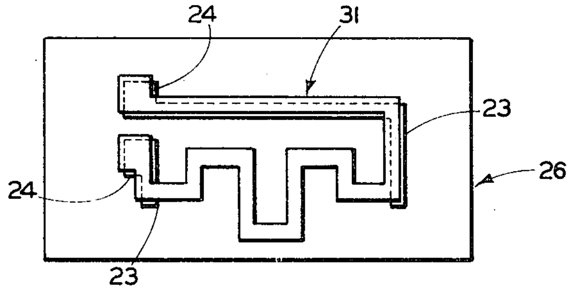

The coated substrate 26 is then etched with an etchant which only attacks the conductive film 28 to form the conductors 23—23 and the termination pads 24—24. The mask 29 is then removed and the coated substrate 26 is remasked with an etch-resist material to form a mask 31 (FIG. 4) in the form of the entire thin-film circuit 20 (i.e., the resistor and the conductor-termination pad pattern). Ideally, the mask 31 should register precisely with the previously formed conductors 23—23 and the termination pads 24—24, as shown in FIG. 4. However, because the dimensions of the conductors may be quite small, of the order of .002 to .004 of an inch, a misregistration of as little as .0005 to .001 of an inch, which might be regarded as perfect in some instances, could actually be a considerable portion of the conductor width. An example of misregistration is shown in FIG. 5 where the mask 31 only covers a portion of the conductor-termination pad pattern. As a result of the misregistration, the portion of the conductor-termination pad pattern not protected will be removed during the subsequent etching step, thereby substantially decreasing the dimensions of the conductor-termination pad pattern. This results in (1) the conductors 23—23 having higher resistance than desired and (2) a reduction in the area available for bonding. Either of these consequences could render the circuit unsatisfactory for use.

PRIOR ART II

Figure 6:
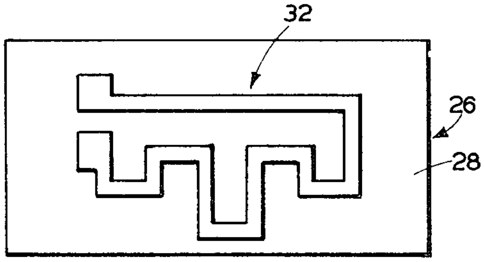
FIGS. 6 and 7 are views illustrating some of the steps involved in a second prior art technique of selectively etching the coated substrate of FIG. 2 to form the circuit of FIG. 1.
Figure 7:
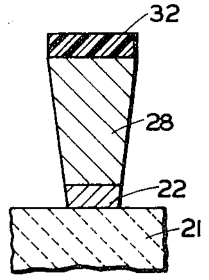

In accordance with the second technique, the coated substrate 26 is first selectively masked with an etch-resist material by any suitable technique, such as those discussed in connection with Prior Art I, to form a mask 32, as seen in FIG. 6. The mask 32 corresponds in shape, and thereby protects, those portions of the coated substrate 26 from which the resistor 22, the conductors 23—23 and the termination pads 24—24 are to be formed. When the films 28 and 27 of the coated substrate 26 are subsequently etched, preferably sequentially (i.e., first with an etchant for the film 28 and next with an etchant for the film 27), the etchants not only eat downward from the mask 32, but also remove material sideways. As a result of this isotropic action, the width of the mask prevails at the top surface of the film 28, but a much narrower width exists at the bottom surface with the concomitant result that the resistor 22 is considerably narrower than the overlying mask 32, as clearly shown in FIG. 7 which is a removed sectional view taken through one of the resistor legs after etching. In order to complete the thin-film circuit 20, the conductive film 28 overlying the resistor 22 is removed by any conventional selective etching technique. As should be apparent, because of the undercutting, the resistor 22 is much narrower than desired and therefore of a higher resistance value than that desired to enable effective anodization. In fact, in some cases, undercutting could result in a resistance increase such that the value of the resistor is higher than the final desired value.

THE INVENTION

The problems associated with the prior art techniques are avoided, in accordance with this invention, by first using a "rough" mask to enable removal of the conductive film 28 overlying the resistor portion of the circuit and then using a single precision mask for the generation of the entire circuit pattern.

Figure 8:
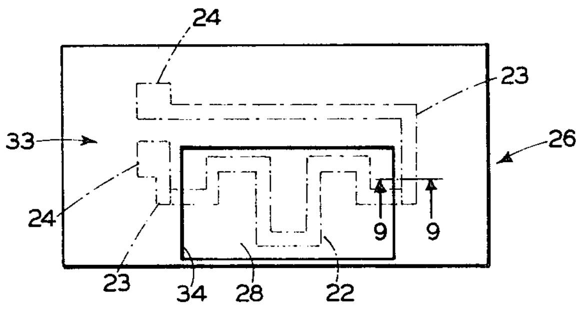
FIGS. 8–11 are views illustrating some of the steps involved in selectively etching the intermediate substrate of FIG. 2, in accordance with this invention, to form the circuit of FIG. 1.

More specifically, referring to FIG. 8, the coated substrate 26 is first coated with an etch-resist material by any suitable technique, such as one of those discussed in connection with the Prior Art I, to form a mask 33 over the entire coated substrate, except for a "rough" window 34 which exposes the general area from which the resistor 22 is to be formed. Considerable latitude may be used in both the size and location of the window 34; the only requirement being that the window expose the meandering path of the resistor 22 to be formed. Of course, the window 34 should not be so large that it exposes any of the portions from which the conductor-termination pad pattern is to be formed.

Figure 9:
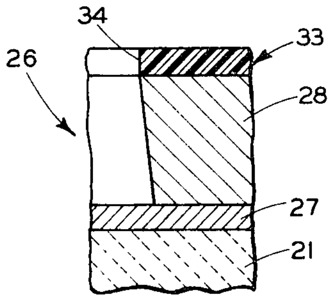
Figure 10:
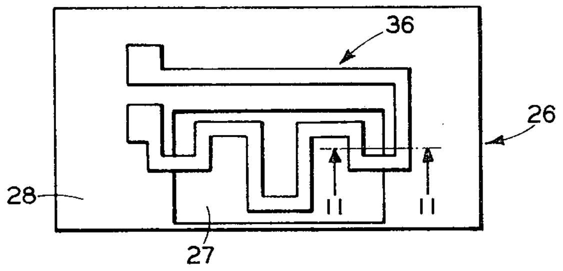
Figure 11:
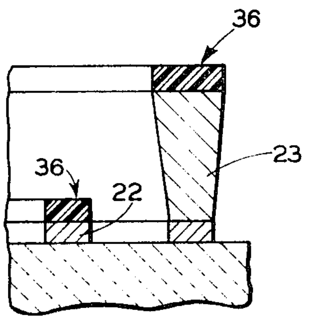

Upon subsequent etching with an etchant that only attacks the film 28, the film 28 is removed from within the window 34, thereby uncovering the resistive film 27 in this area, as shown in the enlarged partial cross section of FIG. 9. The mask 33 is then removed and the coated substrate 26 is recoated with an etch-resist material to form a mask 36 corresponding to both the resistor and the conductor-termination pad patterns, as shown in FIG. 10. The enlarged cross section of FIG. 11 shows the resultant structure after etching first with an etchant that attacks the film 28 and then with an etchant that attacks the film 27. As seen in FIG. 11, the width of the resistor 22 is equal to the full width of the mask 36 without any undercutting and, although the conductors 23—23 (only one of which is shown in FIG. 11) are undercut, there is no misregistration because there was no first forming of conductors with which registration would have to take place. The undercutting of the conductors 23—23 and the termination pads 24—24 does not have any practical detrimental effect, so that the problem of destroying the dimension of the resistor 22 itself by undercutting has been overcome without generating the problem of misregistration.

Although the etchants employed will depend on the specific constituents of the films 27 and 28, the following table lists the etchants for the specific materials mentioned herein:

| Film | Common etchants |
|---|---|
| Tantalum or tantalum nitride. | Mixture of hydrofluoric acid and nitric acid. |
| Nichrome | Hydrochloric acid, or a mixture of hydrochloric acid and copper chloride. |
| Gold | Aqua regia, or a mixture of potassium iodide and iodine. |
| Palladium | Do. |
| Titanium | Dilute hydrofluoric acid. |
| Copper | Hydrochloric acid, ferric chloride, or nitric acid. |

After removal of the mask 36, the thin-film circuit 20 appears as shown in FIG. 1. As is conventional, external leads may now be attached to the termination pads 24—24, for example, as by thermocompression bonding. Thereafter, the resistor 22 may be trim anodized to value by the technique disclosed in U.S. Pat. 3,148,129 and then thermally aged in air to provide additional stability.

Further details of the manufacture and processing of thin-film circuits are disclosed in an article by McLean et al. entitled "Tantalum-Film Technology," Proceedings of the IEEE, vol. 52, No. 12, December 1964, pp. 1450–1462.

What is claimed is:

1. A method of making a thin-film circuit from a substrate having a first coating of material from which a resistor element of the circuit is to be formed and a second coating of material deposited on the first coating from which a conductive element of the circuit is to be formed, which comprises the steps of:
   (a) masking the coated substrate with a first mask of a material resistant to an etchant for the second coating, the first mask covering the portion of the substrate from which the conductive element is to be formed and having an opening registering with the portion from which the resistor is to be formed, the opening being larger in area than the resistor to be formed;
   (b) subjecting the masked substrate to an etchant for the second coating to remove the second coating, thereby exposing the first coating at the portion of the substrate where the resistor is to be formed;
   (c) removing the first mask;
   (d) masking the coated substrate with a second mask which defines, in a single precision mask, both the conductive element and the resistor, with the resistor portion of the mask situated where the second coating was previously removed, the second mask being composed of a material resistant to an etchant for both the first and second coatings; and
   (e) subjecting the masked substrate to etchants for the second coating and then for the first coating to remove the unmasked first and second coatings whereby the resistor and the conductive elements are formed without the need of precise registration of the first and second masks.

2. A method as recited in claim 1, wherein:
   step (a) is accomplished by applying a first photoresist layer to the coated substrate, exposing selected portions of the first photoresist layer to light and then developing the first photoresist layer; and
   step (d) is accomplished by applying a second photoresist layer to the coated substrate, exposing selected portions of the second photoresist layer to light and then developing the second photoresist layer.

3. A method as recited in claim 1, wherein the first coating material is tantalum or a compound thereof.

4. A method as recited in claim 1, wherein the first coating material is tantalum nitride.

5. A method as recited in claim 4, wherein the second coating includes a layer of titanium over the first coating and a layer of gold over the titanium layer.

6. A method as recited in claim 4, wherein the second coating includes a layer of a nickel-chromium alloy over the first coating, a layer of copper over the nickel-chromium layer and a layer of palladium over the copper layer.

References Cited

UNITED STATES PATENTS

| | | | |
|---|---|---|---|
| 3,256,588 | 6/1966 | Sikina et al. | 29—155.5 |
| 3,423,205 | 1/1969 | Skaggs et al. | 96—36.2 |
| 3,489,656 | 1/1970 | Balde | 204—15 |
| 3,242,006 | 3/1966 | Gerstenberg | 117—201 |

OTHER REFERENCES

IBM Technical Disclosure Bulletin, vol. 8, No. 9, February 1966, Forming Thin-film Chain Memory Planes, by Young.

JACOB H. STEINBERG, Primary Examiner

U.S. Cl. X.R.

156—17; 96—36.2; 29—624